US007052952B2

(12) United States Patent
Bae et al.

(10) Patent No.: US 7,052,952 B2
(45) Date of Patent: May 30, 2006

(54) METHOD FOR FORMING WIRE LINE BY DAMASCENE PROCESS USING HARD MASK FORMED FROM CONTACTS

(75) Inventors: In-deog Bae, Seoul (KR); Chang-jin Kang, Suwon (KR); Jeong-sic Jeon, Kyungki-do (KR); Kyeong-koo Chi, Seoul (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 161 days.

(21) Appl. No.: 10/779,494

(22) Filed: Feb. 13, 2004

(65) Prior Publication Data

US 2004/0161923 A1  Aug. 19, 2004

(30) Foreign Application Priority Data

Feb. 14, 2003  (KR) .................. 10-2003-0009359

(51) Int. Cl.
*H01L 21/8242* (2006.01)
(52) U.S. Cl. .................. 438/239; 438/629; 438/633; 438/634; 438/673; 438/713; 438/978
(58) Field of Classification Search ................ 438/239, 438/629, 633, 634, 673, 713, 978, FOR. 458, 438/FOR. 492
See application file for complete search history.

(56) References Cited

U.S. PATENT DOCUMENTS

| 6,274,423 B1 * | 8/2001 | Prall et al. .................. 438/239 |
| 6,486,018 B1 * | 11/2002 | Roberts et al. ............. 438/239 |
| 6,524,907 B1 * | 2/2003 | Parekh et al. ............... 438/253 |
| 6,872,622 B1 * | 3/2005 | Tu .............................. 438/253 |

* cited by examiner

Primary Examiner—George Fourson
Assistant Examiner—Michelle Estrada
(74) Attorney, Agent, or Firm—F. Chau & Associates, LLC

(57) ABSTRACT

A method for forming a wire line by a damascene process includes forming a first insulating layer on a semiconductor substrate, etching the first insulating layer to form a contact hole, and forming a first conductive layer over the first insulating layer that fills the contact hole. The first conductive layer is patterned, and a storage node contact is formed that fills the contact hole and is electrically connected to the semiconductor substrate. A hard mask is formed over the storage node contact and the first insulating layer is etched using the hard mask as an etch mask to form a trench in the first insulating layer. A bit line is formed in the trench that is electrically connected to the semiconductor substrate. A second insulating layer is formed that covers the bit line. The second insulating layer and the hard mask are planarized and a storage node of a capacitor is formed on the storage node contact.

23 Claims, 12 Drawing Sheets

METHOD FOR FORMING WIRE LINE BY DAMASCENE PROCESS USING HARD MASK FORMED FROM CONTACTS

BACKGROUND OF THE INVENTION

This application claims priority based on Korean Patent Application No. 2003-9359, filed on Feb. 14, 2003, in the Korean Intellectual Property Office.

1. Field of the Invention

The present invention relates to the structure of a contact and a wire line of a semiconductor device, and more particularly, to a method for forming a bit line by a damascene process using a hard mask formed from storage node contacts in a DRAM having a bit line formed on a capacitor.

2. Discussion of the Related Art

As semiconductor devices become highly integrated, a multi-layered interconnection structure has been widely used. The interconnection structure includes wire lines and contacts. For example, a semiconductor device, such as a DRAM, includes a semiconductor substrate in which elements, such as a transistor, are formed, a wire line, such as a bit line, is electrically connected to a contact, and a capacitor is formed on the bit line. In this case, in order to connect the capacitor to the semiconductor device electrically, a capacitor contact (or storage node contact) is separated from the bit line and passes beside the bit line.

In general, in order to form a bit line and a capacitor thereover, a capacitor over bit line (COB) structure is formed by forming a storage node contact that passes beside the bit line and is electrically connected to a lower semiconductor substrate. However, as the design rule of semiconductor devices, in particular, DRAMs are reduced severely, it becomes very difficult to form a COB structure.

In a typical COB structure, after a bit line is formed, a storage node contact is formed. In this case, in order to obtain a sufficient process margin, spacers are formed at sides of the bit line, and a hard mask formed of silicon nitride ($Si_3N_4$) is formed on the bit line. The spacers and the hard mask are used so that a storage node contact is formed by a self aligned contact (SAC) process. As a result, the hard mask should be formed to a large thickness on the bit line, so as to perform the SAC process. However, as the design rule of a semiconductor device is reduced, it becomes very difficult to etch a hard mask formed of silicon nitride ($Si_3N_4$) having a large thickness.

As the design rule of the semiconductor device is reduced, an ArF process has been performed essentially during a photolithography process. In the ArF process, the thickness of a photoresist layer is reduced gradually. As such, it is very difficult to form a photoresist pattern having a sufficient thickness to pattern a hard mask formed of silicon nitride ($Si_3N_4$) having a large thickness. Thus, it becomes very difficult to form a hard mask having a sufficient thickness to be used in the SAC process on a bit line.

In addition, when a thick hard mask is used in the SAC process, the height of a bit line stack increases. As such, gap filling cannot be easily performed when filling an interlevel dielectric (ILD) layer between bit lines. That is, a high aspect ratio occurs between bit lines, such that it is difficult to perform gap filling. In particular, as the design rule of the semiconductor device is reduced to less than 90 nm, it becomes difficult to perform gap filling.

In order to form a bit line having a fine critical dimension (CD) as the design rule of the semiconductor device is reduced, attempts to form a bit line by a damascene process after a storage node contact (i.e., capacitor contact) is formed are disclosed in U.S. Patent Publication No. US2002/0022315 A1 (published on Feb. 21, 2002). A method for forming a bit line to be aligned in a capacitor contact by the damascene process can be used even when the design rule of the semiconductor devices is reduced rapidly, by obtaining a larger process margin.

According to the above-described Patent Publication, the upper portion of a capacitor contact has a protective cap and is protected from the damascene process, which is performed by a trench standard lithography process for a bit line.

However, as the design rule of the semiconductor device is reduced rapidly, it becomes difficult to form a photoresist pattern for patterning a trench to a sufficient thickness to be used as an etch mask during an etch process for forming a trench, as described above. In order to pattern a trench reliably, when a photoresist pattern is used as an etch mask, the photoresist pattern should be formed to a sufficient large thickness. However, when the design rule of the semiconductor device is reduced to less than 90 nm, it is very difficult to form a photoresist pattern to a sufficient thickness. In particular, it is very difficult to pattern a photoresist layer to a very large thickness during a photolithography process using an ArF illumination system when the design rule of the semiconductor device is less than 90 nm. In addition, when the photoresist pattern is formed to a large thickness, it is quite probable that the photoresist pattern will collapse.

In addition, as described above, a process for forming a silicon nitride layer as a protective cap on a capacitor contact is accompanied by processes of recessing, depositing, and additionally etching a capacitor contact. As such, a semiconductor device manufacturing process becomes complicated, thereby reducing the productivity of the process.

Accordingly, a need exists for a simplified semiconductor device manufacturing process in which a patterning process for forming a trench to be used in a damascene process is more reliably performed.

SUMMARY OF THE INVENTION

An aspect of the present invention is to provide a simplified method for forming a wire line by a damascene process in which a trench for the wire line can be more reliably patterned so as to reduce the critical dimension (CD) of a wire line as the design rule of a semiconductor device is reduced.

According to an exemplary embodiment of the present invention, there is provided a method for forming a wire line by a damascene process including forming a first insulating layer on a semiconductor substrate, etching the first insulating layer to form a contact hole, and forming a first conductive layer on the first insulating layer that fills the contact hole. The first conductive layer is patterned, and a storage node contact is formed that fills the contact hole and is electrically connected to the semiconductor substrate. A hard mask is formed over the storage node contact. The first insulating layer is etched using the hard mask as an etch mask to form a trench in the first insulating layer. A bit line is formed in the trench that is electrically connected to the semiconductor substrate. A second insulating layer is formed that covers the bit line. The second insulating layer and the hard mask are planarized sequentially and a storage node is formed on the storage node contact.

In at least one embodiment, the method further comprises forming a transistor on the semiconductor substrate, and the bit line and the storage node contact are electrically connected to the transistor, respectively.

The first conductive layer is formed of a conductive material by which an etch selectivity to the first insulating layer can be obtained. For example, in order to obtain the etch selectivity, the first conductive layer is formed of polysilicon, and the first insulating layer is formed of silicon oxide.

The hard mask extends on the first insulating layer in a line shape and is connected to the storage node contact. The hard mask is formed to a critical dimension (CD) narrower than a top CD of the contact hole.

The patterning of the first conductive layer includes forming a photoresist pattern having a line shape over the first conductive layer that overlaps the contact hole, and etching the first conductive layer using the photoresist pattern as an etch mask so that a top surface of the first insulating layer is exposed.

In at least one embodiment, the method further includes forming a trench spacer on a sidewall of the trench. The trench spacer can be formed of silicon oxide.

The bit line is formed by forming a second conductive layer of a material different from that of the first conductive layer over the trench, and etching the second conductive layer selectively so that a surface of the second conductive layer is lower than an entrance of the trench.

According to another exemplary embodiment of the present invention, there is provided a method for forming a wire line by a damascene process including forming a first insulating layer on a semiconductor substrate, etching the first insulating layer to form a contact hole, and forming a first conductive layer over the first insulating layer that fills the contact hole. The first conductive layer is patterned, and a storage node contact is formed that fills the contact hole and is electrically connected to the semiconductor substrate. A hard mask is formed over the storage node contact. The first insulating layer is taper-etched using the hard mask as an etch mask to form a trench, which is separated from the contact hole by a barrier wall having tilted sidewalls and formed of a remaining portion of the first insulating layer. A bit line is formed that is electrically connected to the semiconductor substrate in the trench. A second insulating layer is formed that covers the bit line. The second insulating layer and the hard mask are planarized sequentially and a storage node is formed on the storage node contact. The contact hole is formed by a taper etch process so as to extend a width of the barrier wall. In at least one embodiment, the method further includes forming a trench spacer on the barrier wall.

According to another exemplary embodiment of the present invention, there is provided a method for forming a wire line by a damascene process including forming a first insulating layer on a semiconductor substrate, taper-etching the first insulating layer to form a contact hole having a tilted sidewall, and forming a first conductive layer over the first insulating layer that fills the contact hole. The first conductive layer is patterned, and a storage node contact is formed that fills the contact hole and is electrically connected to the semiconductor substrate. A hard mask is formed over the storage node contact. The first insulating layer is taper-etched using the hard mask as an etch mask to form a trench, which has a tilted sidewall is separated from the contact hole by a barrier wall formed of a remaining portion of the first insulating layer. A bit line is formed in the trench that is electrically connected to the semiconductor substrate. A second insulating layer is formed that covers the bit line. The second insulating layer and the hard mask are planarized sequentially and a storage node is formed on the storage node contact.

According to another exemplary embodiment of the present invention, there is provided a method for forming a wire line by a damascene process including forming a first insulating layer on a semiconductor substrate, etching the first insulating layer to form a contact hole having a tilted sidewall, and forming a polysilicon layer over the first insulating layer that fills the contact hole. The polysilicon layer is patterned, and a storage node contact is formed that fills the contact hole and is electrically connected to the semiconductor substrate. A hard mask is formed over the storage node contact. The first insulating layer is etched using the hard mask as an etch mask to form a trench in the first insulating layer. An etch stopper is formed of titanium nitride over sidewalls of the trench. A tungsten layer is formed over the etch stopper that fills the trench. The tungsten layer is selectively etched so that a portion of the etch stopper formed over sidewalls of the trench is exposed, and the tungsten layer is recessed in the trench to form a bit line that is electrically connected to the semiconductor substrate. The exposed portion of the etch stopper is selectively removed. A second insulating layer is formed that covers the bit line. The second insulating layer and the hard mask are planarized and a storage node is formed on the storage node contact.

The etch stopper can extend to cover the hard mask.

According to another exemplary embodiment of the present invention, there is provided a method for forming a wire line by a damascene process, including forming a first insulating layer on a semiconductor substrate, taper-etching the first insulating layer to form a contact hole having a tilted sidewall and forming a polysilicon layer over the first insulating layer that fills the contact hole. The polysilicon layer is patterned, and a storage node contact is formed that fills the contact hole and is electrically connected to the semiconductor substrate. A hard mask is formed that over the storage node contact. The first insulating layer is taper-etched using the hard mask as an etch mask to form a trench, which is separated from the contact hole by a barrier wall having a tilted sidewall and formed of a remaining portion of the first insulating layer. An etch stopper is formed of titanium nitride over sidewalls of the trench. A tungsten layer is formed over the etch stopper that fills the trench.

The tungsten layer selectively etched so that a portion of the etch stopper formed over sidewalls of the trench is exposed, and the tungsten layer is recessed in the trench to form a bit line that is electrically connected to the semiconductor substrate. The exposed portion of the etch stopper is removed. A second insulating layer is formed that covers the bit line. The second insulating layer and the hard mask are planarized, and a storage node is formed on the storage node contact.

BRIEF DESCRIPTION OF THE DRAWINGS

The above and other aspects and advantages of the present invention will become more apparent by describing in detail preferred embodiments thereof with reference to the attached drawings in which.

DETAILED DESCRIPTION OF PREFERRED EMBODIMENTS

The present invention will be described more fully hereinafter with reference to the accompanying drawings in which preferred embodiments of the invention are shown.

In various exemplary embodiments of the present invention, when manufacturing a semiconductor device employing a capacitor over bit line (COB) structure, a bit line is formed by a damascene process after storage node contacts used to electrically connect a capacitor to a semiconductor substrate are formed. Exemplary embodiments of the present invention also provides for forming a hard mask to be used as an etch mask during a lithography process of forming a trench for a bit line when the bit line is formed by the damascene process.

In exemplary embodiments of the invention, the hard mask is formed from storage node contacts, thereby minimizing additional process steps for forming the hard mask. Formation of the hard mask helps to reduce the thickness of a photoresist pattern for a lithography process of forming a trench. That is, the photoresist pattern can be formed to a smaller thickness such that the trench can be reliably formed even though the design rule of a semiconductor device is reduced rapidly to be less than 0.9 nm.

Formation of the hard mask requires additional steps in a process, so an entire process may be more complicated. Embodiments of the present invention provide for forming a hard mask when storage node contacts are formed.

As a result, the hard mask is formed of a material used for forming storage node contacts, thereby omitting and reducing deposition and patterning processes used to form the hard mask. In addition, the hard mask is formed from the storage node contacts, such that a spacer, which can be formed preferably on a sidewall of a trench so as to enhance insulation separation between a bit line and a storage node, can be formed of silicon oxide having a smaller dielectric constant than that of silicon nitride. That is, a step of forming a spacer of silicon nitride can be omitted so as to obtain an insulation characteristic, thereby reducing a parasitic capacitance between bit lines.

Figure 1A:
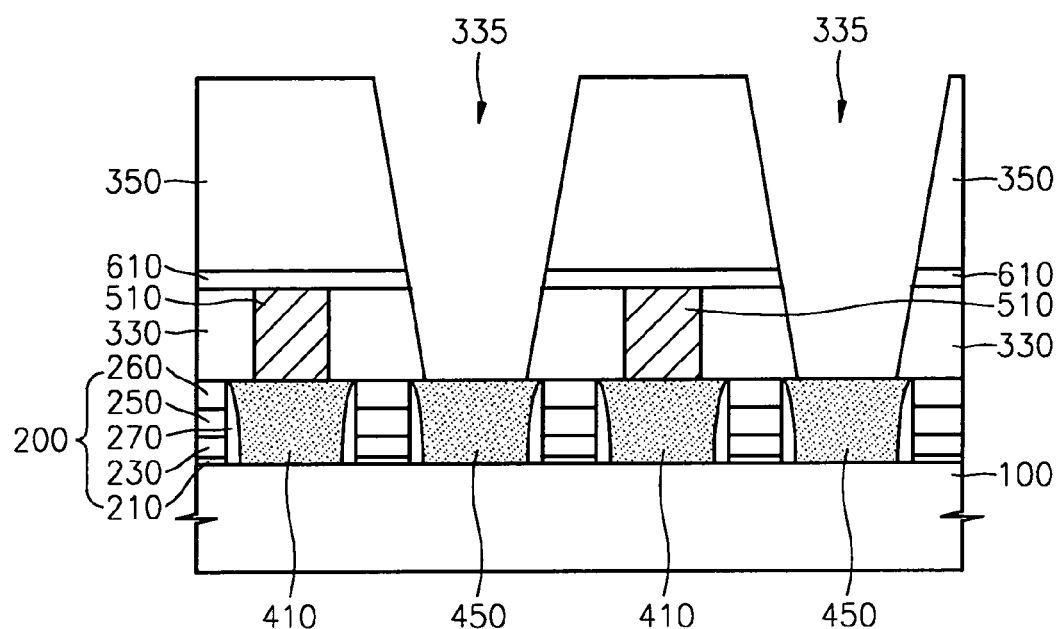
FIGS. 1A and 1B are a cross-sectional view and a plane view, respectively, schematically illustrating a step of forming a contact hole for a storage node contact according to an embodiment of the present invention.
Figure 1B:
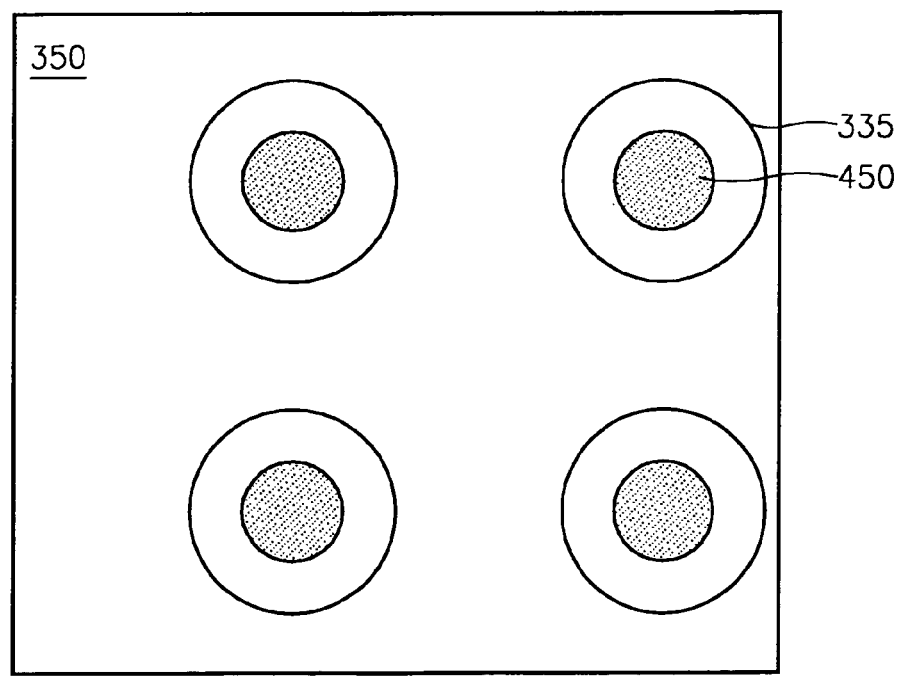

FIGS. 1A and 1B are a cross-sectional view and a plane view, respectively, schematically illustrating a step of forming a contact hole 335 for a storage node contact according to an embodiment of the present invention.

Referring to FIGS. 1A and 1B, to electrically connect a semiconductor substrate 100 to a capacitor, a contact hole 335 is formed to form a storage node contact electrically connected to a storage node. Currently, a COB structure is generally used in a semiconductor device, such as in a DRAM. In the present embodiment, forming a storage node contact is first performed before a bit line is formed.

According to an embodiment of the present invention, a gate stack 200 is formed on the semiconductor substrate 100, so as to form a transistor. The gate stack 200 includes conductive layers forming gates 230 and 250. The gates 230 and 250 can be made of, for example, a silicon layer and metallic silicide layer, respectively, such as, for example, a conductive polysilicon layer and a tungsten silicide layer. In this embodiment, a capping insulating layer 260 may be formed on the gates 230 and 250, and a gate spacer 270 may be formed at sides of the gates 230 and 250. A drain/source region where a transistor is to be formed is formed on the semiconductor substrate 100 adjacent to the gates 230 and 250.

A first insulating layer (not shown) for insulation may be formed between the gate stacks 200, and a plurality of conductive pads 410 and 450 that pass through the first insulating layer may be formed. The conductive pads 410 and 450 are formed so as to prevent the narrowness of a process margin, which may occur as the design rule of the semiconductor device is reduced. The conductive pads 410 and 450 may be formed of a variety of conductive materials, such as, for example, conductive polysilicon. In addition, the conductive pads 410 and 450 may be formed simultaneously so that a plurality of conductive pads may be placed in their proper positions during a single process. Nevertheless, the conductive pads 410 and 450 may be divided into first conductive pads 410 and second conductive pads 450 according to the type of device or wire line which will be later electrically connected to the conductive pads 410 and 450.

The first conductive pads 410 may provide electrical connection between a bit line that will be formed later and the semiconductor substrate 100, and the second conductive pads 450 may provide electrical connection between a capacitor that will be formed later and the semiconductor substrate 100. The conductive pads 410 and 450 are electrically connected to drain or source regions according to their positions, respectively.

A second insulating layer 330 is formed on the first insulating layer. The first insulating layer and the second insulating layer 330 may be formed of an insulating material, such as, for example, silicon oxide. The second insulating layer 330 is formed to a thickness of about 1500 Å. In this embodiment, after the second insulating layer 330 is formed, a first contact 510 that passes through the second insulating layer 330 and is electrically connected to the first conductive pad 410 is formed. The first contact 510 together with the first conductive pads 410 provide electrical connection between the bit line and the semiconductor substrate 100. Thus, the first contact 510 corresponds to a direct contact (DC). As a result, the bit line contacts the first contact 510, and the second insulating layer 330 insulates the bit line from the lower first conductive pad 410.

A contact hole for exposing the first conductive pad 410 is formed by selectively etching the second insulating layer 330, a conductive layer for filling the contact hole is formed, and the conductive layer is patterned by a patterning process, such as planarization, thereby forming the first contact 510. In this embodiment, a conductive material used for forming the second contact 510 may be tungsten (W). When the first contact 510 is formed using a tungsten layer, titanium/titanium nitride (Ti/TiN) layer may be further formed on the tungsten layer as an etch stopper or a polishing stopper.

After the first contact 510 that passes through the second insulating layer 330 is formed, as shown in FIG. 1A, a first etch stopper 610 that covers the first contact 510 is formed. The first etch stopper 610 is formed so as to detect an etch stop point during an etch process for forming a trench. Thus, the first etch stopper 610 may be formed of a material used for forming a third insulating layer 350, such as, for example, an insulating material, such as silicon nitride, by which a sufficient etch selectivity to silicon oxide can be obtained. The silicon nitride layer may be formed to a thickness of about 500 Å. As will be described later, the first etch stopper 610 can obtain the bottom critical dimension (CD) of a trench by controlling an etch process for forming the trench.

After the first etch stopper 610 is formed, the third insulating layer 350 is formed on the first etch stopper 610. The third insulating layer 350 is formed to a thickness at which a capacitor can be formed in a traditional COB structure. That is, the capacitor is formed later on the third insulating layer 350. The third insulating layer 350 may be formed of a variety of insulating material. However, preferably, the third insulating layer 350 may be formed of an insulating material by which an etch selectivity to a material used for forming a storage node contact that will be formed later can be obtained. For example, the third insulating layer 350 may be formed of silicon oxide to a thickness of about 2500 Å.

After the third insulating layer 350 is formed, a contact hole 335 for exposing the second conductive pad 450 is formed by selectively etching the third insulating layer 350. In this case, the step of forming the contact hole 335 may be performed by a small contact etch process. For example, after a photoresist pattern (not shown) for exposing a portion of the third insulating layer 350 is formed by a photolithography process, the exposed portion of the third insulating layer 350 and the lower second insulating layer 330 are selectively etched using the photoresist pattern as an etch mask, thereby forming the contact hole 335. In this case, an etch process for forming the contact hole 335 may be performed using a hard mask. The hard mask may be formed of polysilicon.

Even though the step of forming the contact hole 335 is performed by a small contact etch process, a sufficient process margin caused by reduction in a design rule can be obtained, because the step of forming the contact hole 335 is performed before the bit line is formed.

The second and third insulating layers 330 and 350 are etched to a thickness of about 3000–4000 Å to form the contact hole 335. On the other hand, when a conventional bit line self aligned contact (SAC) process is performed, the thicknesses of the second and third insulating layers 330 and 350 are about 5000–5500 Å, because a very high capping layer should be formed on the bit line. As such, in the method according to the present embodiment of the invention, a large bottom opening of the contact hole 335 can be obtained.

Preferably, an etch process for forming the contact hole 335 is performed by a taper etch process. As will be described later, this is because a barrier wall by which the contact hole 350 can be separated from the trench can be self formed.

According to the present embodiment, even when the design rule is 82 nm and the step of forming the contact hole 335 is performed by a contact process having a design rule of 100 nm, a sufficient bottom CD of the contact hole 335 of at least greater than 42 nm, for example, can be obtained. Conversely, when a bit line is first formed as in the prior art, when a design rule is 82 nm, it is difficult to obtain a bottom CD of the contact hole 335 greater than 35 nm. In addition, a bottom CD of the contact hole 335 can be obtained only when the contact hole 335 is formed by a contact process performed with a design rule smaller than 100 nm. This is because in the prior art a contact hole is etched by the bit line SAC process, making it is very difficult to open the bottom of the contact hole as the design rule is reduced rapidly.

In the present embodiment described above, even though an etch process of forming the contact hole 335 is performed by a taper etch process, a sufficient bottom CD of the contact hole 335 can be obtained. In a case of the design rule of about 90 nm, a top CD of the contact hole 335 may be about 121 nm, and a bottom CD of the contact hole 335 may be about 85 nm.

Figure 2:
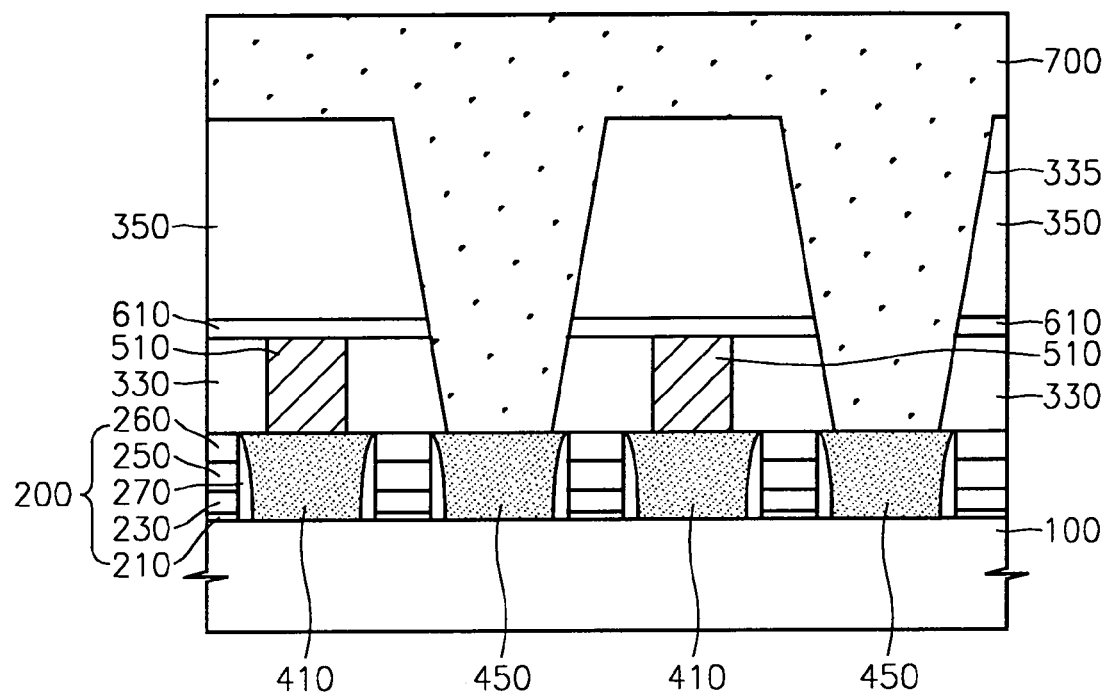
FIG. 2 is a cross-sectional view schematically illustrating a step of forming a first conductive layer for filling a contact hole according to an embodiment of the present invention.

FIG. 2 is a cross-sectional view schematically illustrating a step of forming a first conductive layer 700 for filling the contact hole 335 according to an embodiment of the present invention.

Referring to FIG. 2, a first conductive layer 700 for filling the contact hole 335 is formed on the third insulating layer 350. In this embodiment, the first conductive layer 700 may be formed to a thickness at which the contact hole 335 can be filled, for example, so that the thickness of a portion that extends over the third insulating layer 350 may be about 1000–1500 Å.

In this embodiment, the first conductive layer 700 which fills the contact hole 335 may be deposited so as to form a second contact, for example, a storage node contact or a buried contact (BC). In addition, the first conductive layer 700 is formed so as to form a hard mask for forming a trench for a bit line on the third insulating layer 350. Thus, the first conductive layer 700 should be formed of a conductive material having a sufficient conductivity, so as to form a second contact electrically connected to the second conductive pad 450. In addition, preferably, the first conductive layer 700 is formed of a material by which a sufficient etch selectivity to silicon oxide used for forming the third insulating layer 350 can be obtained, so as to be used as the hard mask.

The first conductive layer 700 may be formed of conductive polysilicon, for example, since this material has a sufficient etch selectivity to silicon oxide. After the polysilicon layer is deposited as the first conductive layer 700, the surface of the polysilicon layer is planarized by etching or chemical mechanical polishing (CMP). This planarization process may be performed so as to obtain a wider resolution margin during a subsequent photolithography process.

Figure 3A:
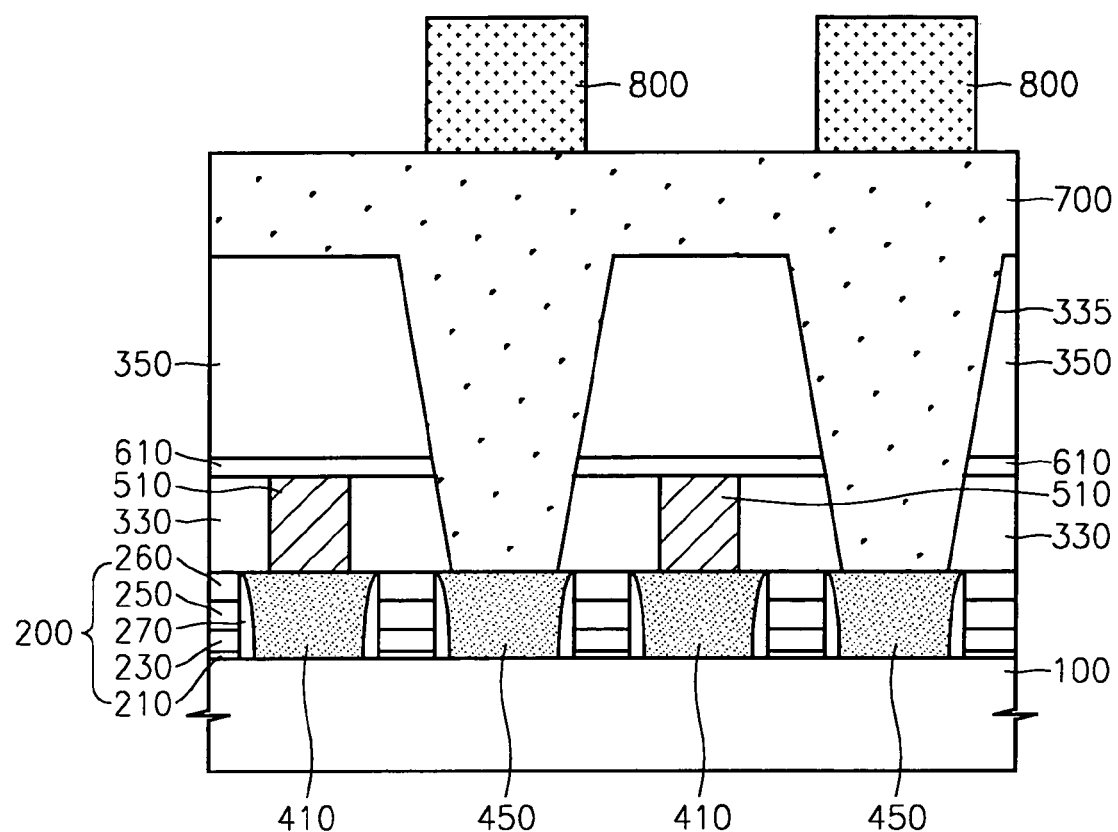
FIGS. 3A and 3B are a cross-sectional view and a plane view, respectively, schematically illustrating a step of forming a photoresist pattern for patterning the first conductive layer according to an embodiment of the present invention.
Figure 3B:
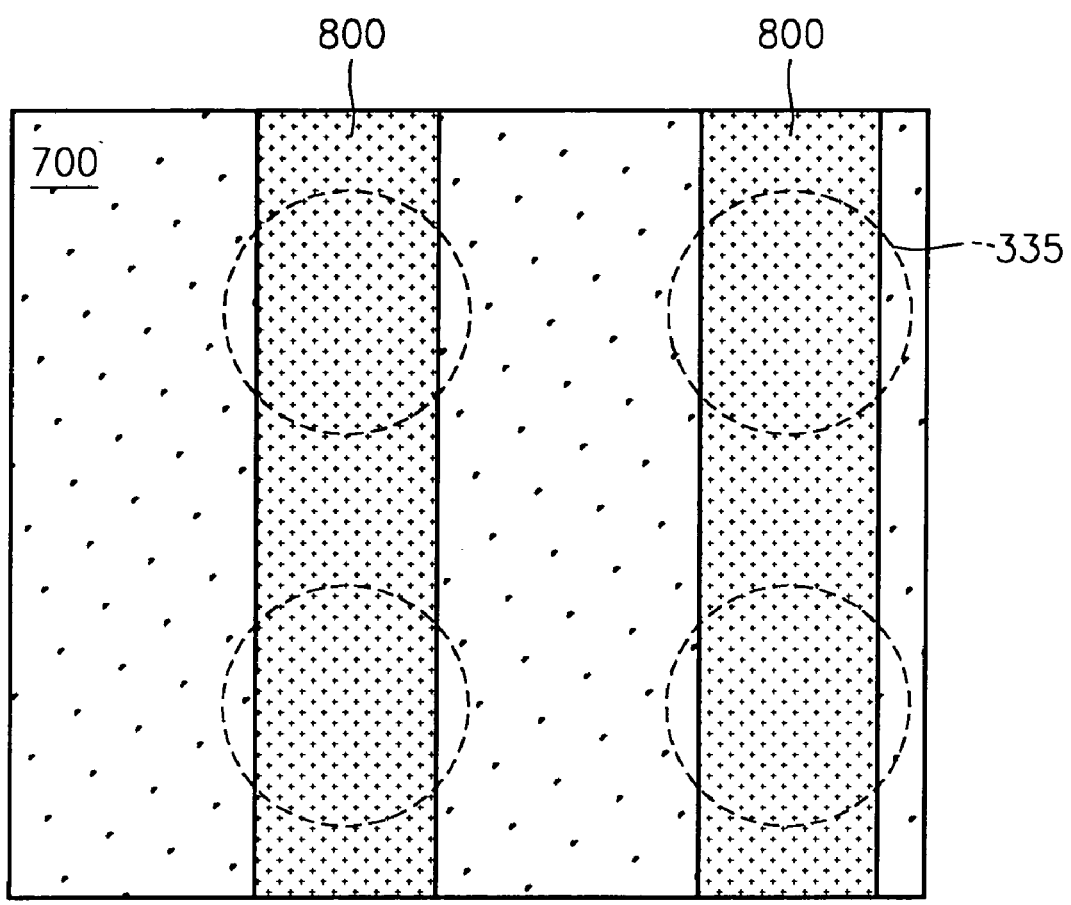

FIGS. 3A and 3B are a cross-sectional view and a plane view, respectively, schematically illustrating a step of forming a photoresist pattern 800 for patterning the first conductive layer 700 according to an embodiment of the present invention.

Referring to FIGS. 3A and 3B, the first conductive layer 700 is patterned, thereby forming a photoresist pattern 800 that selectively covers a portion of the first conductive layer 700 that extends over the third insulating layer 350. The photoresist pattern 800 is formed so as to pattern the hard mask, which will be formed so as to form the trench for a bit line on the third insulating layer 350. Thus, the photoresist pattern 800 may be formed in a reverse bit line (B/L) shape.

Since the reverse B/L shape is a line pattern, a sufficient resolution margin can be obtained during the photolithography process. Thus, a photoresist pattern can be precisely formed even when the design rule is reduced. The photoresist pattern 800 may be a narrow pattern, such as, for example, a pattern having a top CD narrower than that of the contact hole 335 for a storage node contact. When the photoresist pattern 800 is patterned to a narrow CD, the CD of the bit line can be controlled using a wider process margin. The photoresist pattern 800 may be formed to have a CD of about 80 nm.

Figure 4A:
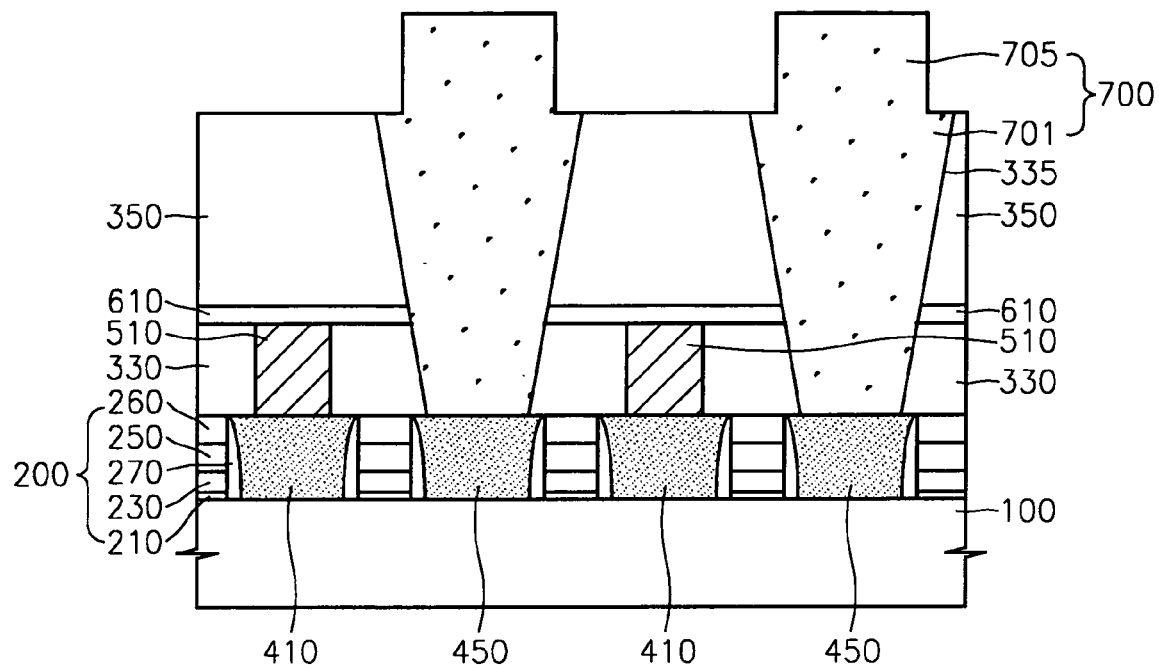
FIGS. 4A and 4B are a cross-sectional view and a plane view, respectively, schematically illustrating a step of forming a hard mask according to an embodiment of the present invention.
Figure 4B:
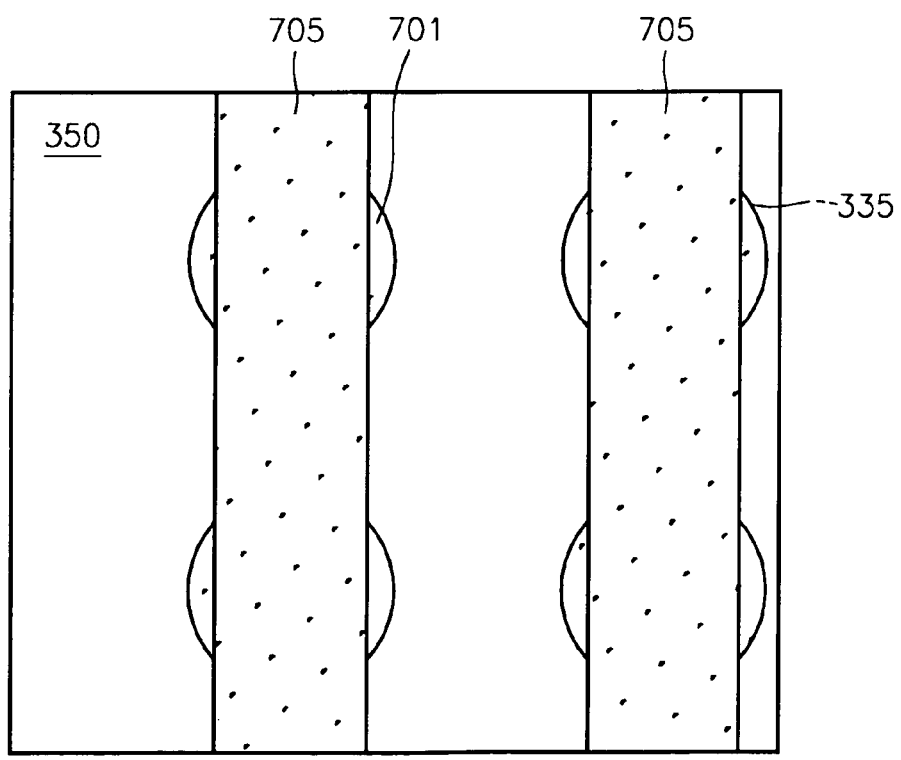

FIGS. 4A and 4B are a cross-sectional view and a plane view, respectively, schematically illustrating a step of forming a hard mask 705 according to an embodiment of the present invention.

Referring to FIGS. 4A and 4B, a portion of the conductive layer (700 of FIG. 3A) exposed by the photoresist pattern 800 is selectively etched using the photoresist pattern (800 of FIG. 3A) as an etch mask. In this case, the top surface of the third insulating layer 350 under the first conductive layer 700 should be exposed by the etch process. As such, a hard mask 705 having an elongated line shape is formed from the first conductive layer 700. The hard mask 705 is placed on a portion of the first conductive layer 700 for filling the contact hole 335, i.e., on top of a storage node contact or a second contact 701. When the CD of the photoresist pattern 800 is narrower than that of the contact hole 335, the portion of the first conductive layer 700 for filling the contact hole 335, i.e., a portion of the top surface of the second contact 701, is also exposed.

The hard mask 705 is formed as an elongated line shape with a CD of about 80 nm by an etch process in which the photoresist pattern 800 is used as an etch mask. The photoresist pattern 800 is formed to a thickness at which the hard mask 705 can be patterned, and thus may be formed to a relatively small thickness. Thus, the photoresist pattern 800 having a sufficient reliability can be formed by a photolithography process using an ArF light source used in the design rule less than 90 nm.

In addition, the hard mask 705 can be self formed when the storage node contact, i.e., the second contact 701, is formed.

Figure 5A:
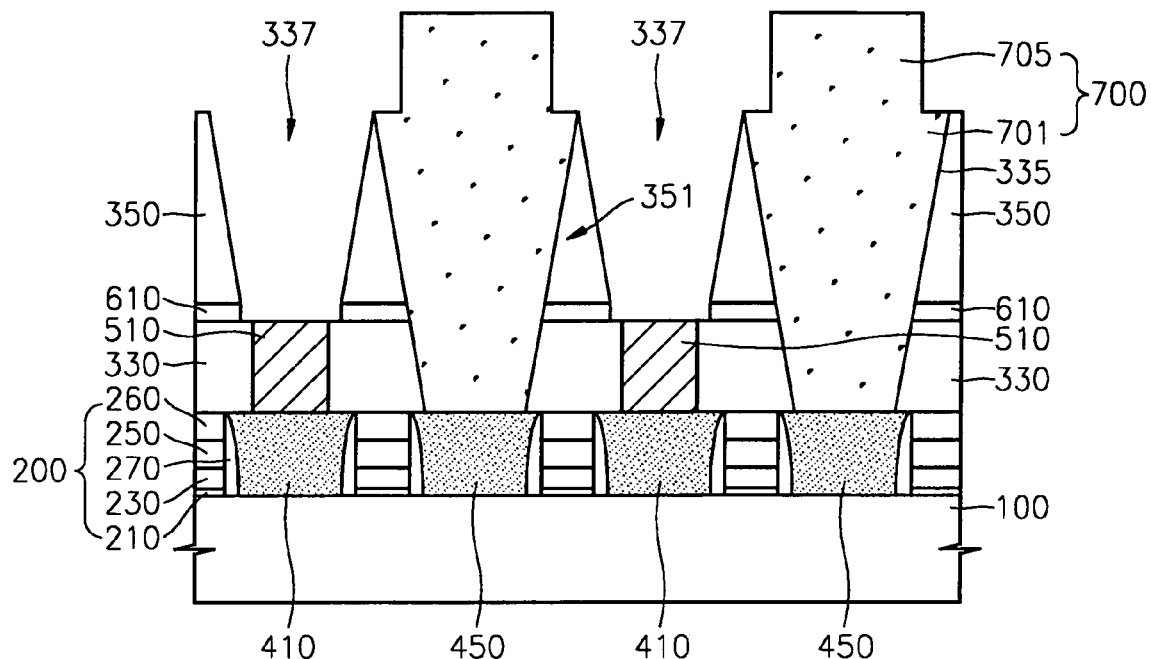
FIGS. 5A and 5B are a cross-sectional view and a plane view, respectively, schematically illustrating a step of forming a trench according to an embodiment of the present invention.
Figure 5B:
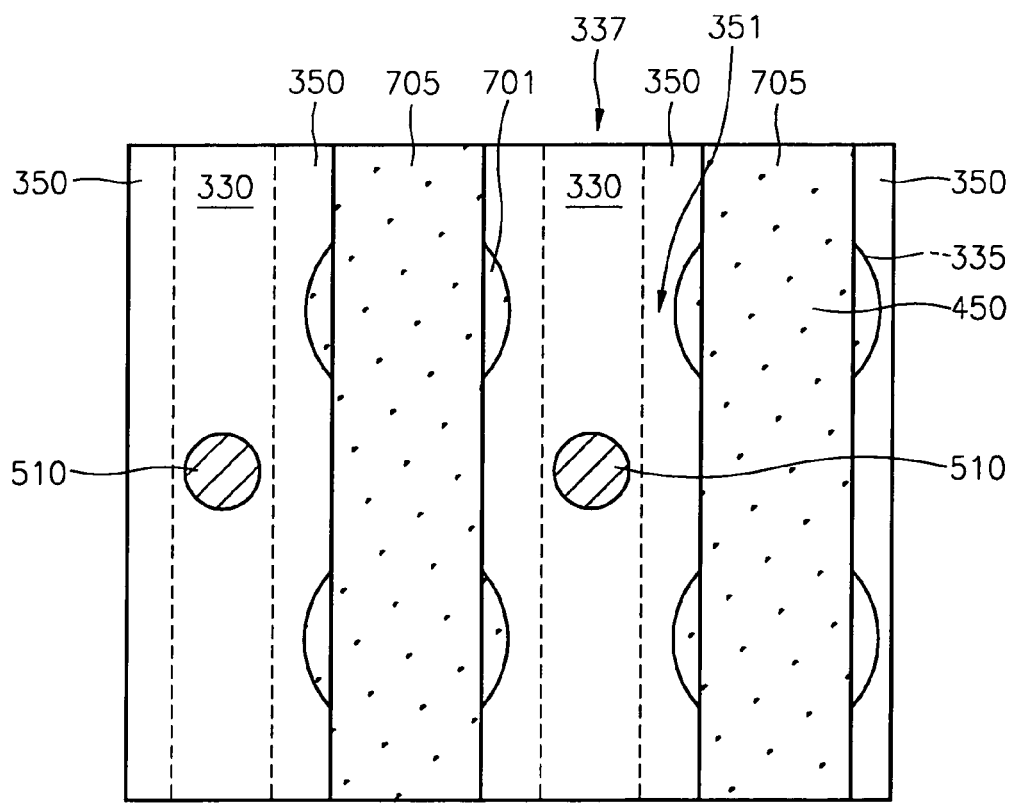

FIGS. 5A and 5B are a cross-sectional view and a plane view, respectively, schematically illustrating a step of forming a trench 337 according to an embodiment of the present invention.

Referring to FIGS. 5A and 5B, an exposed portion of the third insulating layer 350 is selectively etched using the hard mask 705 as an etch mask, thereby forming a trench 337. In this case, the top surface of the storage node contact exposed outside the hard mask 705, i.e., the top surface of the second contact 701, may act as an etch mask. The etch process for forming the trench 337 may be perfomed in a state where a portion of the photoresist pattern 800 remains on the hard mask 705, or may be formed after removing the remaining photoresist pattern 800 by ashing and stripping processes.

Preferably, the etch process for forming the trench 337 using the hard mask 705 is performed by a taper etching process. A process margin between the second contact 701 and the lower second conductive pad 450 is about 43–48 nm. Preferably, the bottom CD of the trench 337 is narrower than a top CD of the trench 337 so that the trench 337 is separated or insulated from the second conductive pad 450 at a sufficient interval, in consideration of the process margin between the second contact 701 and the second conductive pad 450. In addition, preferably, the etch process for forming the trench 337 is performed by the taper etch process, so as to obtain a sufficient insulation or separation interval between the trench 337 and the second contact 701.

An interval between hard masks 705 may be about 85 nm when the design rule is about 82 nm. Thus, the top CD of the trench 337 formed using the hard mask 705 may be about 85 nm. Thus, to form a barrier wall having a sufficient thickness between the second contact 701 and the trench 337 and to separate the trench 337 from the second conductive pad 510 at a sufficient interval, the bottom CD of the trench 337 may be narrower than 64 nm, which is narrower than the top CD of the trench 337.

The trench 337 and the contact hole 335 are formed by a taper etch process, such that a barrier wall 351 can be formed of a portion of the third insulating layer 350 in which a space between the trench 337 and the second contact 701 remains. The width of the barrier wall 351 increases downwardly. The barrier wall 351 may be formed to a thickness of greater than about 30 nm at the bottom of the trench 337. Thus, the bit line that fills the trench 337 and the second contact 701, i.e., the storage node contact, may be electrically separated from each other by the barrier wall 351 at a sufficient interval.

Taper etch processes are preferably used to form the trench 337 and/or the contact hole 335, such that the barrier wall 351 is self formed between the bit line that fills the trench 337 and the second contact 701 that fills the contact hole 335. Thus, insulation between the bit line and the second contact 701 can be reliably obtained.

An etch process for forming the trench 337 is stopped by the first etch stopper 610 formed under the third insulating layer 530, and an exposed portion of the first etch stopper 610 is selectively removed by ashing and stripping processes. As a result, the lower first contact 510 is exposed to the trench 337. Since the etch process may be stopped relatively uniformly by the first etch stopper 610, the formation of the first etch stopper 610 helps maintain uniformity of the bottom CD of the trench 337.

Figure 6A:
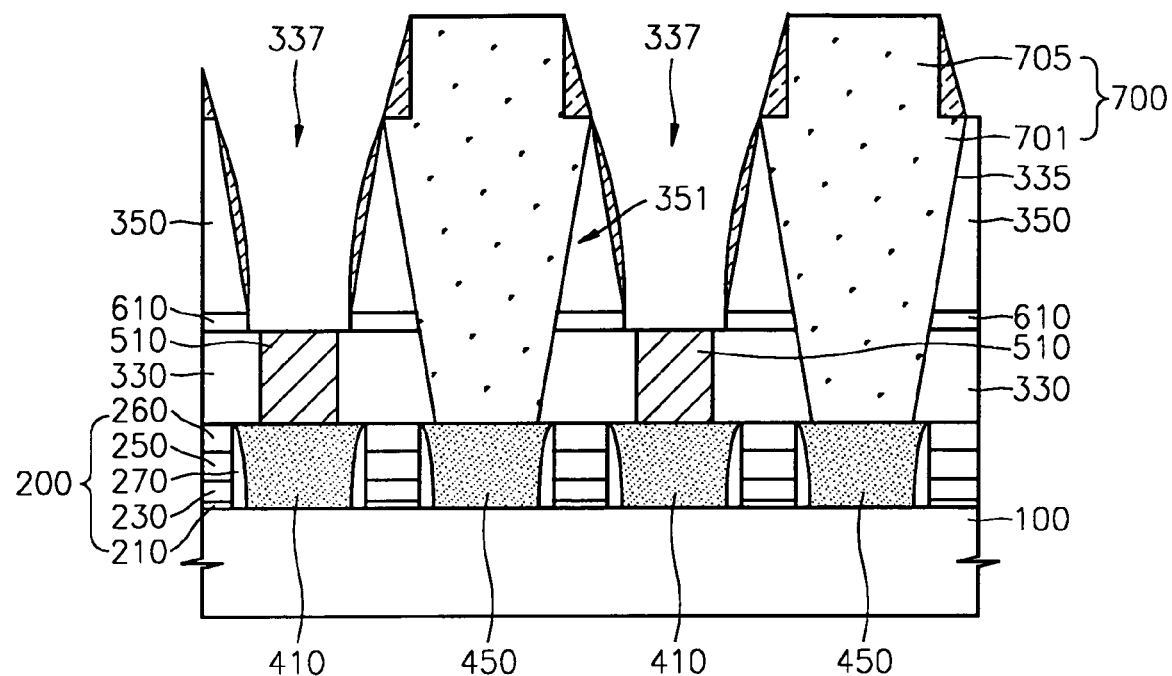
FIGS. 6A and 6B are a cross-sectional view and a plane view schematically illustrating a step of forming a trench on a barrier wall according to an embodiment of the present invention.
Figure 6B:
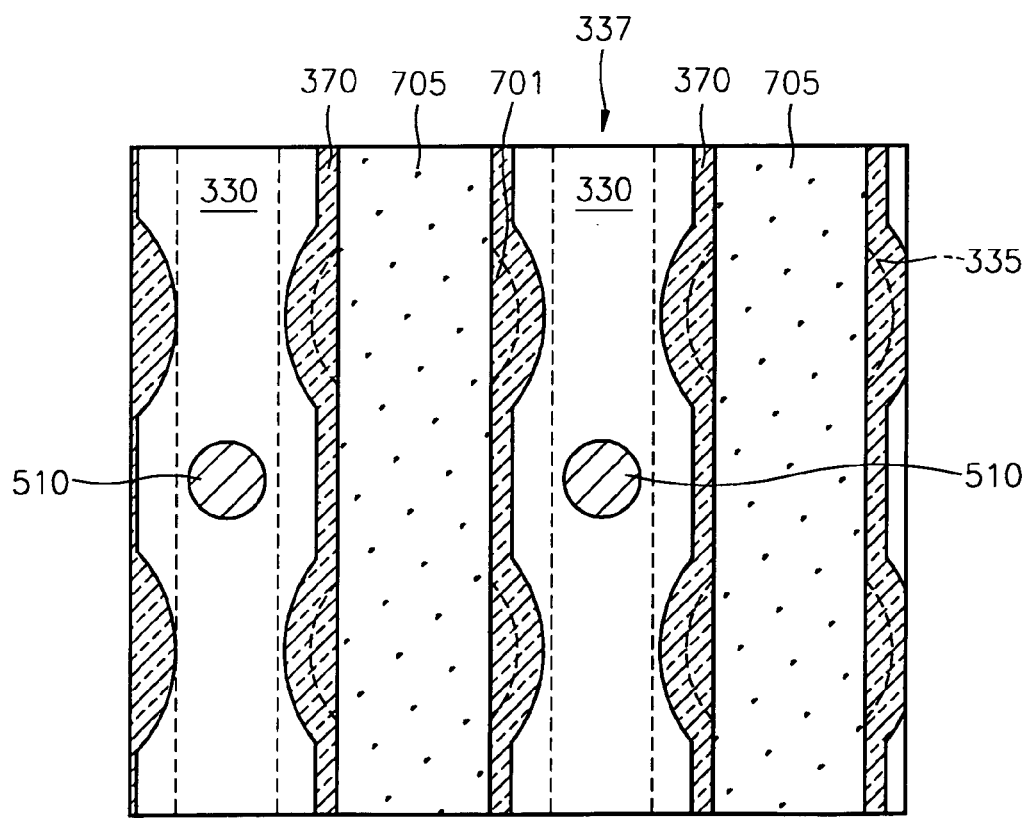

FIGS. 6A and 6B are a cross-sectional view and a plane view, respectively, schematically illustrating a step of forming a trench 337 on a barrier wall 351 according to an embodiment of the present invention.

Referring to FIGS. 6A and 6B, a trench spacer 370 is optionally formed on the barrier wall 351. The trench spacer 370 may be formed so as to improve the reliability of separation of the trench 337 and the contact hole 335 by the barrier wall 351. A spacer layer is deposited on the sidewall of the trench 337 and the barrier wall 351 in a liner shape and anisotropically etched, thereby forming the trench spacer 370.

The trench spacer 370 may be formed of an insulating material, such as, for example, silicon nitride or silicon oxide. Preferably, the trench spacer 370 is formed of an insulating material having a relatively low dielectric constant, such as silicon oxide, so as to minimize parasitic electrostatic capacitance between bit lines, which will be formed later in the trench 337. The trench spacer 370 may not be necessary if the barrier wall 351 is maintained at a sufficient thickness and insulated and separated between the bit line (or the trench 337) and the second contact 701 at a sufficient interval.

Figure 7:
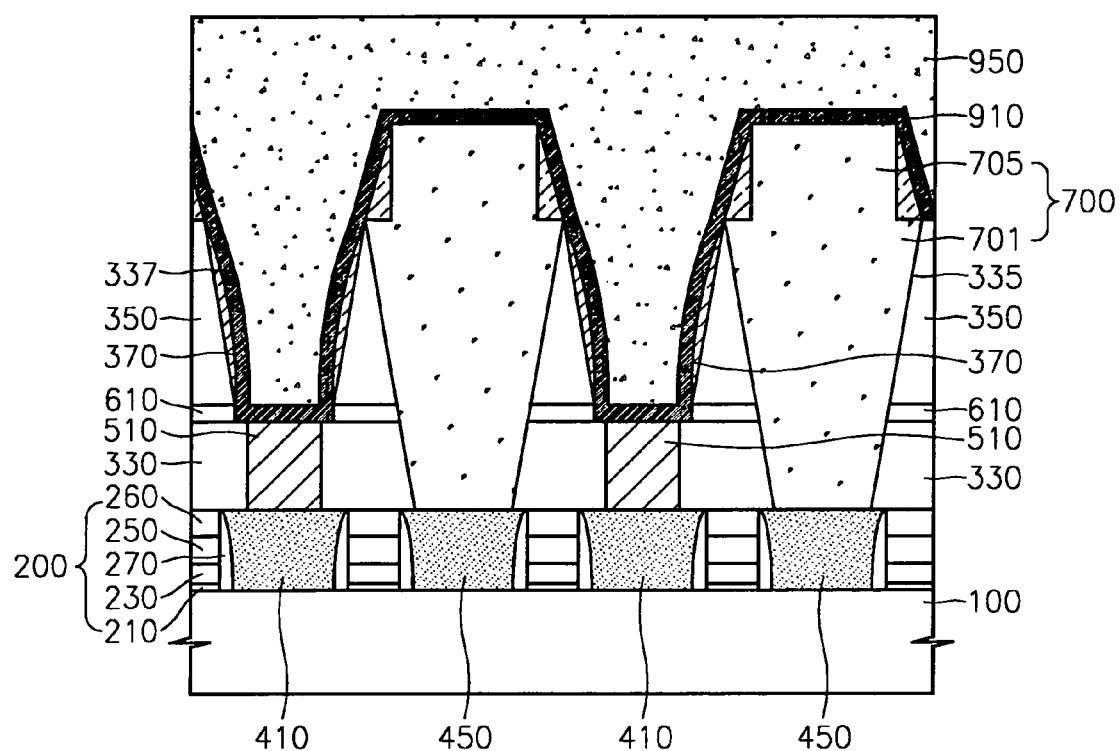
FIG. 7 is a cross-sectional view schematically illustrating a step of forming a second conductive layer for filling the trench according to an embodiment of the present invention.

FIG. 7 is a cross-sectional view schematically illustrating a step of forming a second conductive layer 950 for filling the trench 337 according to an embodiment of the present invention.

Referring to FIG. 7, in order to form a bit line in the trench 337, a second conductive layer 950 that fills the trench 337 is formed. The second conductive layer 950 may be formed of a conductive material, such as, for example, tungsten (W), so as to control the resistance of the bit line caused by rapid reduction in the design rule. The tungsten layer may be formed to a thickness at which the trench 337 can be filled, for example, to a thickness of about 1500 Å.

Before the second conductive layer 950 is formed, a second etch stopper 910 including a TiN layer may be further formed as a lower layer for the second conductive layer 950. Preferably, the second etch stopper 910 including the TiN layer is a Ti/TiN layer. When the second conductive layer 950 is a tungsten layer, the second etch stopper 910 is used as an etch stopper when performing an etch back process so as to pattern the tungsten layer as a bit line. Since the second conductive layer 950 is recessed deeply in the trench 337 and forms the bit line, the second etch stopper 910 acts as an etch prevention layer that prevents the second contact 701 from being damaged during the etch back process.

Figure 8A:
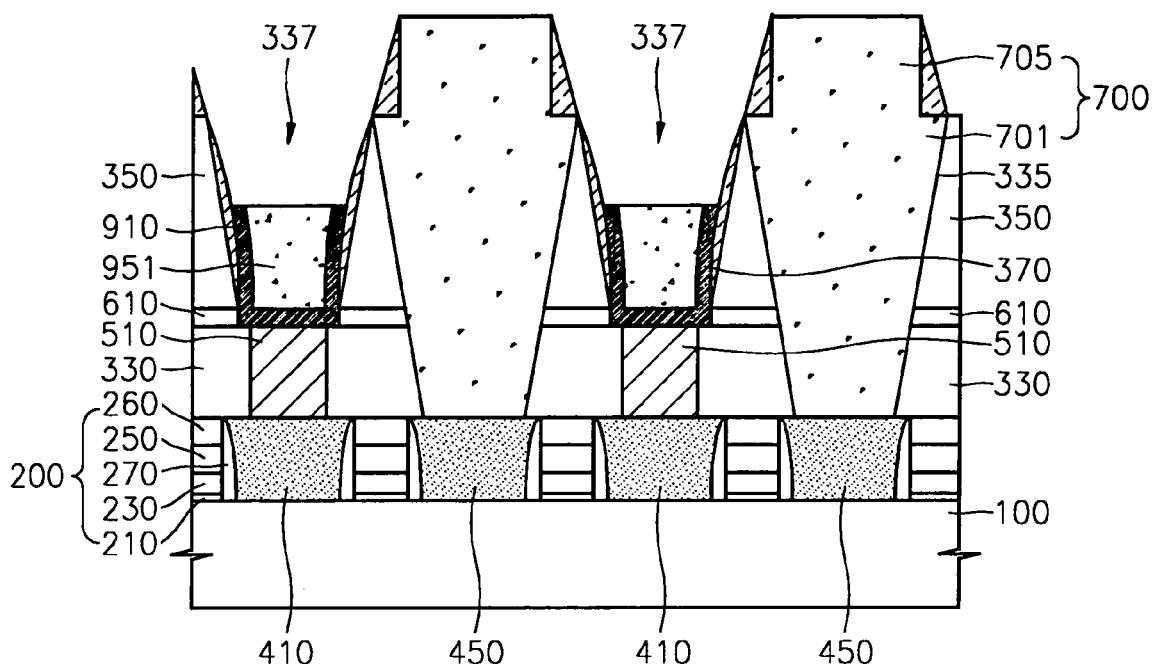
FIGS. 8A and 8B are a cross-sectional view and a plane view, respectively, schematically illustrating a step of etching back the second conductive layer and forming a bit line according to an embodiment of the present invention.
Figure 8B:
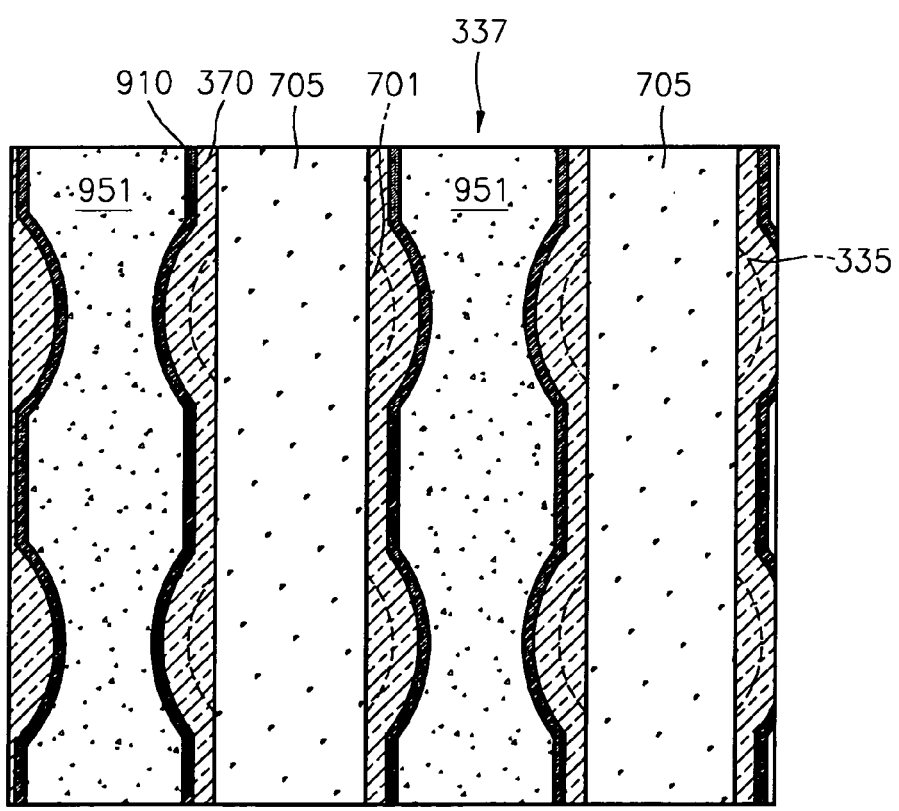

FIGS. 8A and 8B are a cross-sectional view and a plane view, respectively, schematically illustrating a step of etching back the second conductive layer 950 and forming a bit line 951 according to an embodiment of the present invention.

Referring to FIGS. 8A and 8B, the second conductive layer (950 of FIG. 7) is etched back and recessed in the trench 337, thereby forming the bit line 951. In this case, the etch back process is performed so that the second conductive layer 950 is etched while forming a sufficient etch selectivity to the second etch stopper (910 of FIG. 7). Before performing the etch back process, a step of chemical mechanical polishing (CMP) of the second conductive layer 950 may be further performed. The thickness of the second conductive layer 950 can be further reduced by performing the CMP process.

The etch back process may be a wet etch process using acid. During the wet etch process, the tungsten layer used as the second conductive layer 950 is selectively etched with respect to the TiN layer used as the second etch stopper 910. Alternatively, the etch back process may be a dry etch process. In this case, the tungsten layer used as the second conductive layer 950 is etched using an etch gas including $SF_6$. The TiN layer used as the second etch stopper 910 has an etch selectivity to the etch gas.

The TiN layer is formed as the second etch stopper 910 for the tungsten layer, such that the bit line 951 can be formed by etching and recessing the tungsten layer selectively. Subsequently, a portion of the second etch stopper 950, which is used as an etch stopper or an etch prevention layer and exposed by recessing the tungsten layer, is removed by a dry etch process using a $CF_x$ gas. Thus, the lower barrier wall 351 or the trench spacer 370 and the hard mask 705 are exposed.

By forming the bit line 951, the CD of the bit line 951 can be controlled to a CD of the trench 337. In addition, the thickness of the bit line 951 can be controlled by the amount the second conductive layer 950 is recessed.

Figure 9:
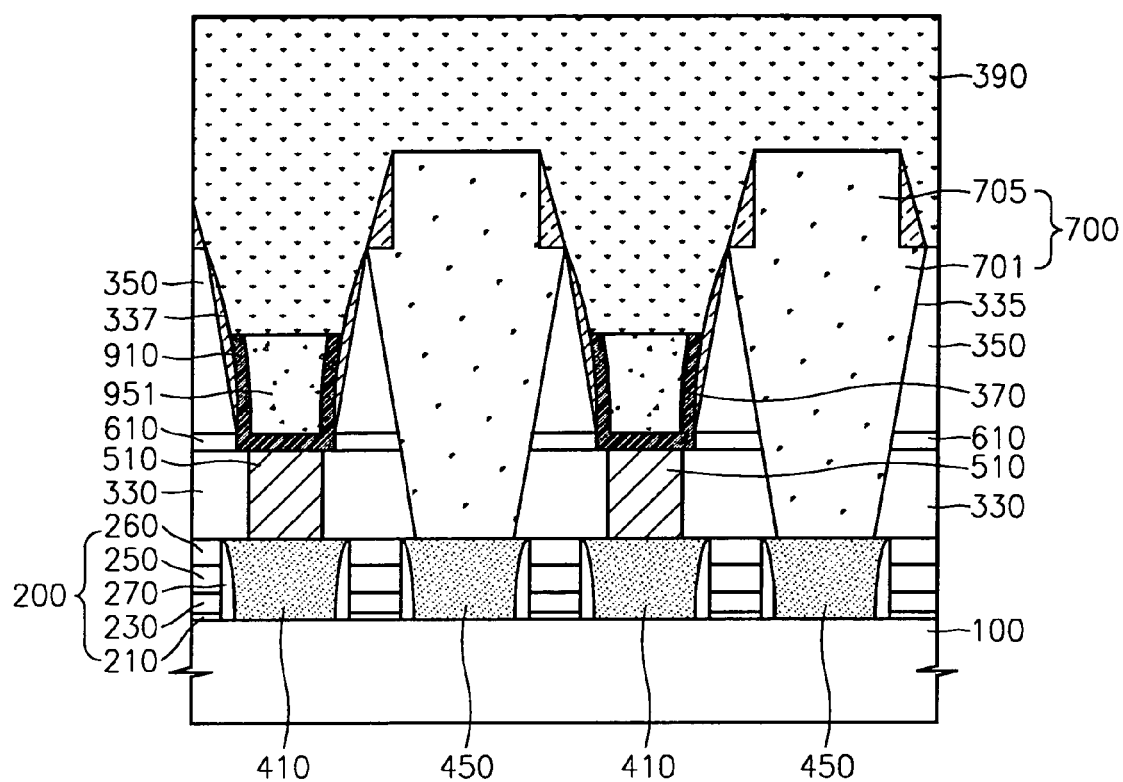
FIG. 9 is a cross-sectional view schematically illustrating a step of forming a fourth insulating layer that covers the bit line according to an embodiment of the present invention.

FIG. 9 is a cross-sectional view schematically illustrating a step of forming a fourth insulating layer 390 that covers the bit line 951 according to an embodiment of the present invention.

Referring to FIG. 9, the fourth insulating layer 390 that covers the bit line 951, which is formed by etching back and recessing the second conductive layer (950 of FIG. 7), is formed. In this case, preferably, the fourth insulating layer 390 is formed to a thickness at which a gap of the trench 337 can be filled. In addition, the fourth insulating layer 390 is formed of silicon oxide.

Figure 10A:
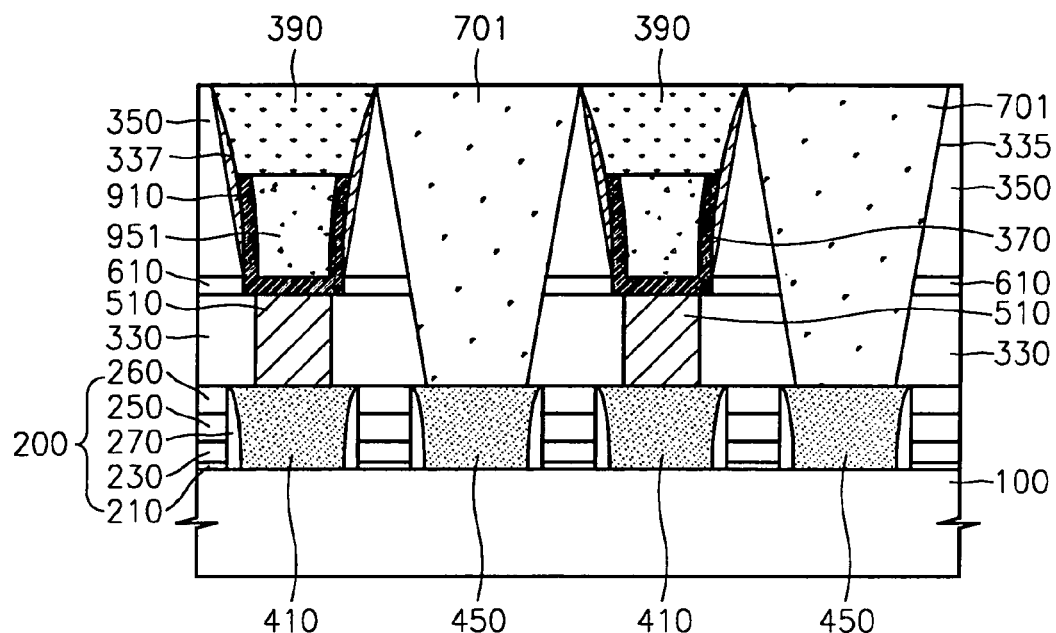
FIGS. 10A and 10B are a cross-sectional view and a plane view schematically illustrating a step of removing a hard mask and separating storage node contacts from one another according to an embodiment of the present invention.
Figure 10B:
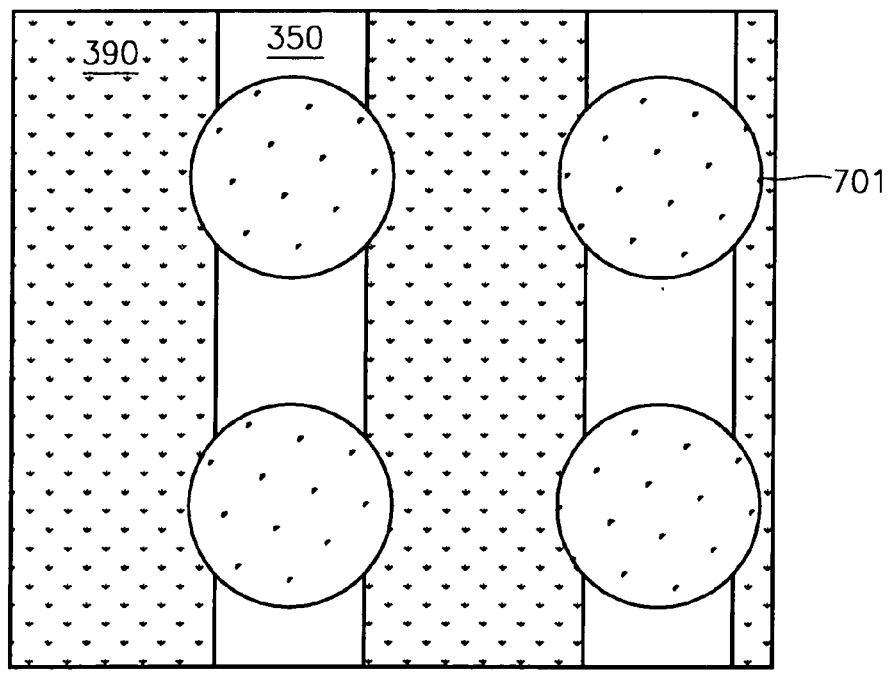

FIGS. 10A and 10B are a cross-sectional view and a plane view, respectively, schematically illustrating a step of removing a hard mask 705 and separating second contacts 701 from one another.

Referring to FIGS. 10A and 10B, the entire surface of the fourth insulating layer 390 is planarized, thereby removing the hard mask 705. For example, the entire surface of the fourth insulating layer 390 is CMPed, thereby removing the hard mask 705 and exposing a portion of the third insulating layer 350 formed under the hard mask 705. As the hard mask 705 is removed, the second contact 701 is separated from each contact hole 335. In addition, the fourth insulating layer 390 is patterned in the shape of a capping layer that covers the bit line 951.

Since the fourth insulating layer 390 acts as the capping layer, when a metal contact (MC) is formed during a subsequent process, an opening ability of the MC is improved. An MC landing pad exposed by the metal contact (MC) may be formed together when the bit line 951 is formed. A thick capping layer, which is a silicon nitride layer, is not formed on the bit line 951, and thus, the MC is easily exposed.

Figure 11:
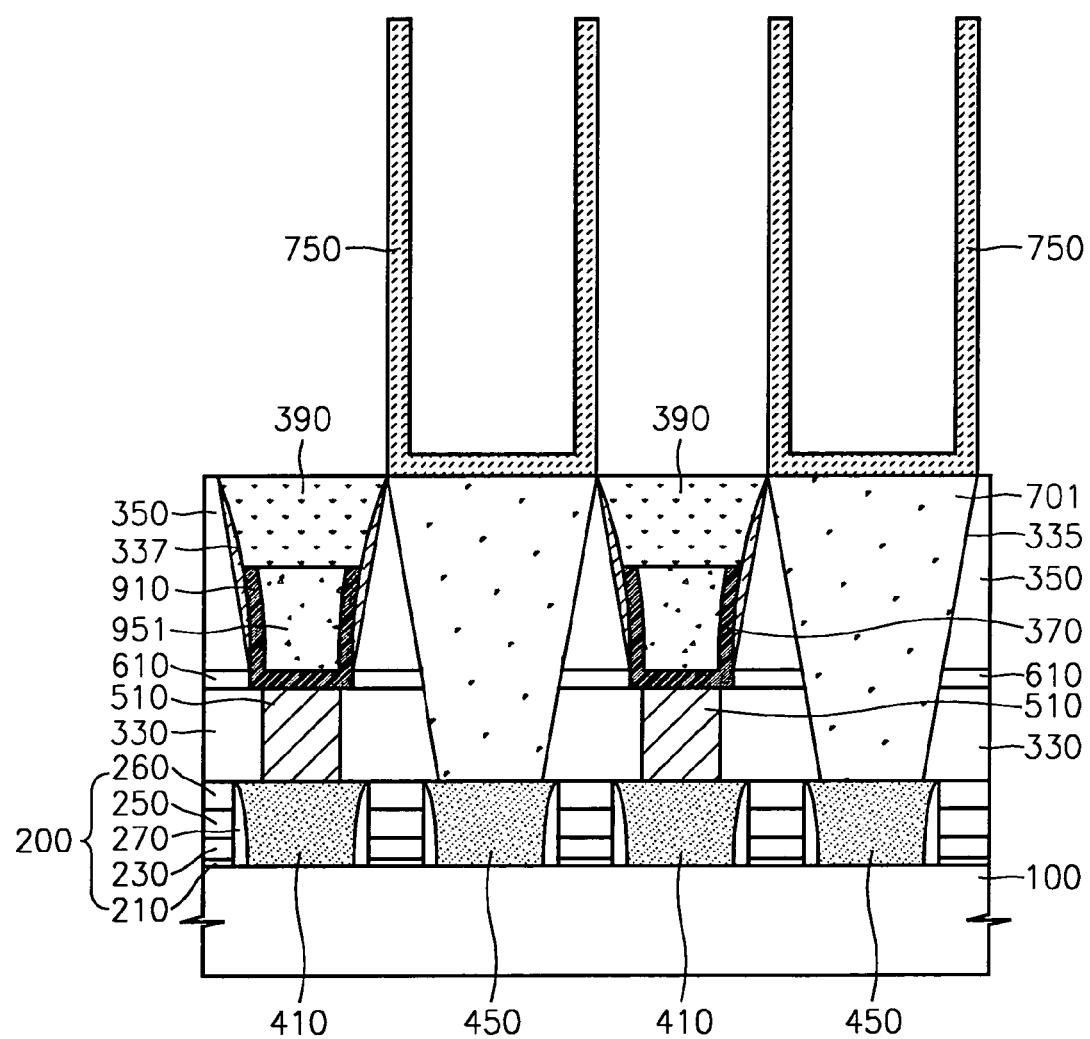
FIG. 11 is a cross-sectional view schematically illustrating a step of forming a storage node of a capacitor on the storage node contacts according to an embodiment of the present invention.

FIG. 11 is a cross-sectional view schematically illustrating a step of forming a storage node 750 on a second contact 701 according to an embodiment of the present invention.

Referring to FIG. 11, the storage node 750 of a capacitor electrically connected to the second contact 701 can be formed in the shape of a cylinder. After that, a capacitor is formed by depositing a dielectric layer (not shown) and a plate node, thereby completing a COB structure.

According to at least one embodiment of the present invention, the design rule of a semiconductor device is prevented from being rapidly reduced to be less than 0.1 μm, thereby reliably forming a bit line in a COB structure. The bit line is formed by a damascene process after a second contact used as a storage node contact is formed, such that electrical connection between a second contact and a lower semiconductor substrate can be reliably formed. That is, when a contact hole for the second contact is formed, the contact hole is formed in a state where the bit line is not formed, such that the opening ability of the contact hole can be improved.

In addition, the hard mask formed together with the second contact is used as an etch mask when a trench for a bit line is formed. When an ArF photolithography process is used, it is difficult to form a thick photoresist layer. However, by forming the hard mask together with the second contact, the number of process steps is minimized, and a trench having a very narrow CD can be formed.

Taper etch processes are used to form the contact hole for the second contact and the trench, such that a barrier wall having a sufficient thickness can be self formed between the second contact and the trench. As such, it is easy to obtain a sufficient insulation characteristic between the bit line for filling the trench and the second contact. In addition, a trench spacer need not be formed of silicon nitride, and the thickness of the trench spacer is minimized, such that parasitic electrostatic capacitance between bit lines can be prevented.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for forming a wire line by a damascene process, the method comprising:
    forming a first insulating layer on a semiconductor substrate;
    etching the first insulating layer to form a contact hole;
    forming a first conductive layer over the first insulating layer that fills the contact hole;
    patterning the first conductive layer;
    forming a storage node contact that fills the contact hole and is electrically connected to the semiconductor substrate;
    forming a hard mask over the storage node contact;
    etching the first insulating layer using the hard mask as an etch mask to form a trench in the first insulating layer;
    forming a bit line that is electrically connected to the semiconductor substrate in the trench;
    forming a second insulating layer that covers the bit line;
    planarizing the second insulating layer and the hard mask; and
    forming a storage node on the storage node contact.

2. The method of claim 1, further comprising forming a transistor on the semiconductor substrate, wherein the bit line and the storage node contact are electrically connected to the transistor.

3. The method of claim 1, wherein the first conductive layer is formed of a conductive material by which an etch selectivity to the first insulating layer can be obtained.

4. The method of claim 3, wherein in order to obtain the etch selectivity, the first conductive layer is formed of polysilicon, and the first insulating layer is formed of silicon oxide.

5. The method of claim 1, wherein the hard mask extends in a line shape and is connected to the storage node contact.

6. The method of claim 1, wherein the hard mask is formed to a critical dimension (CD) narrower than a top CD of the contact hole.

7. The method of claim 1, wherein the step of patterning the first conductive layer comprises:
    forming a photoresist pattern over the first conductive layer, the photoresist pattern having a line shape that overlaps the contact hole; and
    etching the first conductive layer using the photoresist pattern as an etch mask so that a top surface of the first insulating layer is exposed.

8. The method of claim 1, further comprising forming a trench spacer on a sidewall of the trench.

9. The method of claim 8, wherein the trench spacer is formed of silicon oxide.

10. The method of claim 1, wherein the step of forming a bit line comprises:
    forming a second conductive layer of a material different from that of the first conductive layer over the trench; and
    etching the second conductive layer selectively so that a surface of the second conductive layer is lower than an entrance of the trench.

11. A method for forming a wire line by a damascene process, the method comprising:
    forming a first insulating layer on a semiconductor substrate;
    etching the first insulating layer to form a contact hole;
    forming a first conductive layer that fills the contact hole over the first insulating layer;
    patterning the first conductive layer;
    forming a storage node contact that fills the contact hole and is electrically connected to the semiconductor substrate;
    forming a hard mask over the storage node contact;
    taper-etching the first insulating layer using the hard mask as an etch mask to form a trench, the trench having a tilted sidewall and being separated from the contact hole by a barrier wall formed of a remaining portion of the first insulating layer;
    forming a bit line that is electrically connected to the semiconductor substrate, in the trench;
    forming a second insulating layer that covers the bit line;
    planarizing the second insulating layer and the hard mask; and
    forming a storage node on the storage node contact.

12. The method of claim 11, further comprising forming a transistor on the semiconductor substrate, wherein the bit line and the storage node contact are electrically connected to the transistor.

13. The method of claim 11, wherein the contact hole is formed by a taper etch process so as to extend a width of the barrier wall.

14. The method of claim 11, wherein the first conductive layer is formed of a conductive material by which an etch selectivity to the first insulating layer can be obtained.

15. The method of claim 11, further comprising forming a trench spacer on the barrier wall.

16. The method of claim 11, wherein the step of forming a bit line comprises:
    forming a second conductive layer of a material different from that of the first conductive layer over the trench; and
    etching the second conductive layer selectively so that a surface of the second conductive layer is lower than an entrance of the trench.

17. A method for forming a wire line by a damascene process, the method comprising:
    forming a first insulating layer on a semiconductor substrate;
    taper-etching the first insulating layer to form a contact hole having a tilted sidewall;
    forming a first conductive layer over the first insulating layer that fills the contact hole;
    patterning the first conductive layer;
    forming a storage node contact that fills the contact hole and is electrically connected to the semiconductor substrate;
    forming a hard mask over the storage node contact;
    taper-etching the first insulating layer using the hard mask as an etch mask to form a trench, the trench having a tilted sidewall and being separated from the contact hole by a barrier wall formed of a remaining portion of the first insulating layer;
    forming a bit line that is electrically connected to the semiconductor substrate in the trench;
    forming a second insulating layer that covers the bit line;
    planarizing the second insulating layer and the hard mask; and
    forming a storage node on the storage node contact.

18. A method for forming a wire line by a damascene process, the method comprising:
   forming a first insulating layer on a semiconductor substrate;
   etching the first insulating layer to form a contact hole having a tilted sidewall;
   forming a polysilicon layer over the first insulating layer that fills the contact hole;
   patterning the polysilicon layer;
   forming a storage node contact that fills the contact hole and is electrically connected to the semiconductor substrate;
   forming a hard mask over the storage node contact;
   etching the first insulating layer using the hard mask as an etch mask to form a trench in the first insulating layer;
   forming an etch stopper of titanium nitride over sidewalls of the trench;
   forming a tungsten layer that over the etch stopper that fills the trench;
   etching the tungsten layer selectively so that a portion of the etch stopper formed over sidewalls of the trench is exposed and the tungsten layer is recessed in the trench to form a bit line that is electrically connected to the semiconductor substrate;
   removing the exposed portion of the etch stopper;
   forming a second insulating layer that covers the bit line;
   planarizing the second insulating layer and the hard mask; and
   forming a storage node on the storage node contact.

19. The method of claim 18, wherein the etch stopper extends to cover the hard mask.

20. A method for forming a wire line by a damascene process, the method comprising:
   forming a first insulating layer on a semiconductor substrate;
   taper-etching the first insulating layer to form a contact hole having a tilted sidewall;
   forming a polysilicon layer over the first insulating layer that fills the contact hole;
   patterning the polysilicon layer;
   forming a storage node contact that fills the contact hole and is electrically connected to the semiconductor substrate;
   forming a hard mask over the storage node contact;
   taper-etching the first insulating layer using the hard mask as an etch mask to form a trench, the trench having tilted sidewalls and being separated from the contact hole by a barrier wall formed of a remaining portion of the first insulating layer;
   forming an etch stopper of titanium nitride over sidewalls of the trench;
   forming a tungsten layer that fills the trench;
   etching the tungsten layer selectively so that a portion of the etch stopper formed over sidewalls of the trench is exposed and the tungsten layer is recessed in the trench to form a bit line that is electrically connected to the semiconductor substrate;
   removing the exposed portion of the etch stopper;
   forming a second insulating layer that covers the bit line;
   planarizing the second insulating layer and the hard mask; and
   forming a storage node on the storage node contact.

21. A method for forming a wire line by a damascene process, the method comprising:
   forming an insulating layer over a semiconductor substrate;
   forming a contact hole in the first insulating layer;
   forming a storage node contact that fills the contact hole and is electrically connected to the semiconductor substrate;
   forming a hard mask over the storage node contact;
   etching the insulating layer using the hard mask as an etch mask to form a trench in the insulating layer; and
   forming a bit line that is electrically connected to the semiconductor substrate in the trench,
   wherein the storage node contact and the hard mask are formed simultaneously.

22. The method of claim 21, wherein the step of forming the storage node contact and the hard mask comprises:
   forming a first conductive layer over the insulating layer, the first conductive layer filling the contact hole;
   forming a photoresist pattern over the first conductive layer, the photoresist pattern overlapping the contact hole; and
   etching the conductive layer using the photoresist pattern as an etch mask so that a top surface of the first insulating layer is exposed.

23. The method of claim 22, wherein the step of forming a bit line comprises:
   forming a second conductive layer of a material different from that of the first conducting layer over the trench; and
   etching the second conductive layer selectively so that a surface of the second conductive layer is lower than an entrance of the trench.

* * * * *